(12) United States Patent
Wilson et al.

(10) Patent No.: US 6,339,195 B1
(45) Date of Patent: Jan. 15, 2002

(54) APPARATUS FOR IMPROVING PERFORMANCE OF ELECTRICAL INSULATING STRUCTURES

(75) Inventors: Michael J. Wilson, Modesto; David A. Goerz, Brentwood, both of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/658,639

(22) Filed: Sep. 11, 2000

Related U.S. Application Data

(62) Division of application No. 09/109,787, filed on Jul. 2, 1998
(60) Provisional application No. 60/051,518, filed on Jul. 2, 1997.

(51) Int. Cl.⁷ .............................................. H01B 17/26
(52) U.S. Cl. ...................... 174/142; 174/139; 174/151; 174/152 R
(58) Field of Search ................................ 174/142, 139, 174/145, 146, 151, 152 R; 439/63

(56) References Cited

U.S. PATENT DOCUMENTS 4,484,019 A * 11/1984 Grotz ........................ 174/9 R
4,528,421 A * 7/1985 Kishida ...................... 174/143

* cited by examiner

Primary Examiner—Dean A. Reichard
Assistant Examiner—W. David Walkenhorst
(74) Attorney, Agent, or Firm—L. E. Carnahan; Alan H. Thompson

(57) ABSTRACT

Removing the electrical field from the internal volume of high-voltage structures; e.g., bushings, connectors, capacitors, and cables. The electrical field is removed from inherently weak regions of the interconnect, such as between the center conductor and the solid dielectric, and places it in the primary insulation. This is accomplished by providing a conductive surface on the inside surface of the principal solid dielectric insulator surrounding the center conductor and connects the center conductor to this conductive surface. The advantage of removing the electric fields from the weaker dielectric region to a stronger area improves reliability, increases component life and operating levels, reduces noise and losses, and allows for a smaller compact design. This electric field control approach is currently possible on many existing products at a modest cost. Several techniques are available to provide the level of electric field control needed. Choosing the optimum technique depends on material, size, and surface accessibility. The simplest deposition method uses a standard electroless plating technique, but other metalization techniques include vapor and energetic deposition, plasma spraying, conductive painting, and other controlled coating methods.

15 Claims, 7 Drawing Sheets

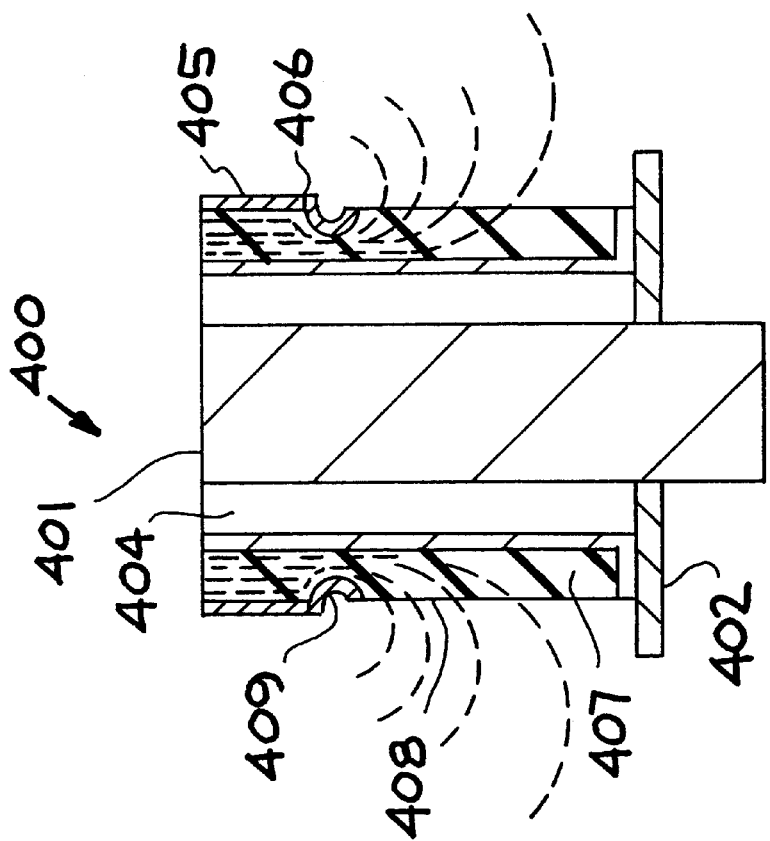
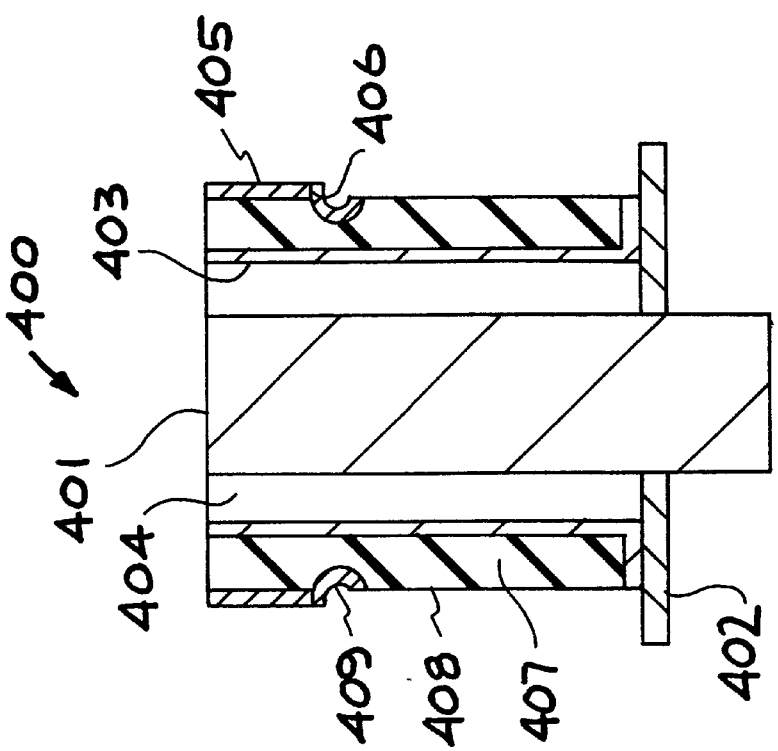
FIG. 4B
FIG. 4A

APPARATUS FOR IMPROVING PERFORMANCE OF ELECTRICAL INSULATING STRUCTURES

RELATED APPLICATION

This is a division of application Ser. No. 09/109,787 filed Jul. 2, 1998.

This application relates to the U.S. Provisional Application No. 60/051,518 filed Jul. 2, 1997, and claims priority thereof.

The United States Government has rights in this invention pursuant to Contract No. W-7405-ENG48 between the United States Department of Energy and the University of California for the operation of Lawrence Livermore National Laboratory.

BACKGROUND OF THE INVENTION

1. Field of the Invention

The present invention relates generally to high-voltage insulating structures, and more particularly to high-voltage bushings, connectors, and capacitors. The invention particularly relates to (i) high-performance feed-through bushings, (ii) high-performance coaxial connectors, (iii) high-performance multilayer film capacitors that can be operated with high-reliability, and (iv) methods for manufacturing these high-performance components where electric field stresses are eliminated or sufficiently reduced in the so-called weak areas.

2. Description of Related Art

Conventional high-voltage devices such as bushings, connectors, and capacitors use a combination of nonconductive and conductive materials to construct desired high-voltage structures. The nonconductive materials provide a dielectric barrier or insulator between two electrodes of different electrical potential. A wide variety of manufacturing techniques can be employed to construct insulators of the desired shape. Some of the processes that are most often used include machining, molding, extrusion, casting, rolling, pressing, melting, painting, vapor deposition, plating, and other free-forming techniques, such as dipping a conductor in a liquid dielectric or filling with dielectric fluid, etc. The selection process must take into account how one or both of the electrodes made from conductive material will be attached or adjoined to the insulator. The most important factors in producing reliable high-voltage structures are thought to be the quality of the shape of the insulator and purity of the insulator material. Ultimately, what limits the operating voltage of any insulation structure is the intrinsic electrical strength of the dielectric material. In practice, however, the operating levels for typical designs are well below the intrinsic breakdown threshold of the insulating material. The onset of electrical induced failure occurs at the point in the material that cannot support the electric field stress. Electric field stress is defined as a function of voltage and geometric shape. Simply stated, the electric field across two infinite plane electrodes is given by the difference in voltage of the two electrodes divided by the separation distance. This is commonly referred to as the uniform or average field stress. Improvements in the operating levels of a typical design are achieved with the use of impregnating materials. An excellent example of the use of impregnates is vacuum impregnated oil filled capacitors. The air in fabricated capacitors is removed and pressure impregnated with evacuated dielectric oil. Also, an example may involve cables with a coating on a center conductor. Another example involving a semiconductive coating on a highly stressed conductor indicates improvement in higher operating level of previous designs. Both techniques show a marked improvement over nonimpregnated designs, but fall short of being able to operate at th intrinsic strength of the material.

The electric field stresses usually cause the most trouble in the critical regions where dissimilar materials meet, particularly at so-called triple-point regions where a metal electrode and two different dielectric materials are in direct proximity. At these locations, electric field stresses can become severely enhanced, increasing as much as the ratio of the dielectric constants of the different materials, or more, depending on the shapes of the materials. An excellent example of the control used to optimize this effect is described in copending U.S. application Ser. No. 09/034,797, filed Mar. 3, 1998, entitled "Ultra-Compact Marx Type High-Voltage Generator," now U.S. Pat. No. 6,060,791 issued May 9, 2000, and assigned to the same assignee. The essence of that invention provides contoured high-dielectric ceramic material and shaped electrodes to control field stress at the triple junction. In contrast, other fabrication techniques may or may not extend electrodes over the edge of straight dielectrics and reduce the operating level of the device. The reduction in operating levels is the result of reaching the intrinsic breakdown level of the weaker dielectric material at lower voltage.

Another problematic area where electric field stresses can lead to failure is in the placement or attachment of electrodes next to solid dielectric materials. Customarily, when the dielectric material is pressed or mechanically fitted between electrodes, there exists small voids that fill with some other material, typically the gas or liquid of the ambient environment in which the high-voltage structure resides. Usually, the material that fills the void has a lower electrical strength than the solid dielectric material, and the electrical field in this highly-stressed region may easily exceed the electrical strength of the void filling material. Moreover, for gas and many liquids having a lower dielectric constant than the solid dielectric, there can be a field concentration in the void region that enhances the likelihood of breakdown in this weaker material.

The present invention overcomes these prior problems by metalizing the surfaces of the solid dielectric materials wherever contact is to be made with metal electrodes. Thus the electric fields are eliminated in the void regions, thereby preventing electrical discharge (corona) activity that can lead to breakdown of the bulk dielectric material. The present invention is similar to the solid-dielectric switch of the above-referenced application, where fields across gaps are removed by metalizing dielectric surfaces. An improvement of high-voltage bushings, connectors, and film-capacitors becomes a natural extension of the above-referenced application.

SUMMARY OF THE INVENTION

It is an object of the present invention to remove the electric field from the weaker areas of the internal volume of high-voltage interconnects.

A further object of the invention is to provide for removing electric fields in weak areas of high-voltage bushings, connectors, and cables, such as transmission lines using wedge dielectric structural supports.

A further object of the invention is to provide a practical means for improving the performance of a wide variety of highly stressed insulating structures.

A further object of the present invention is to provide a method for increasing the high-voltage performance of various bushings, connectors, and metal-film capacitors.

Another object of the invention is to provide a conductive surface on the inside surface of the principal solid dielectric insulator surrounding the center conductor and which connects the center conductor to this conductive surface to eliminate electric fields.

Other objects and advantages of the present invention will become apparent from the following description and accompanying drawings. Basically, the invention involves removing the electric field from the weak areas of the internal volume of high-voltage interconnects.

The key attribute of the present invention is that it makes use of metalized regions over surfaces of dielectric material that will be attached to or in direct contact with adjoining metal electrodes, thus eliminating any electric field from the void region between the primary dielectric insulation and the adjacent metal electrodes where a weaker dielectric medium may exist.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 4A is a cross-sectional view of a further improved bushing with a stress relieved outer metalized surface, in accordance with the present invention.

FIG. 4B illustrates the equal-potential field gradient lines in the improved bushing of FIG. 4A.

DETAILED DESCRIPTION OF THE INVENTION

The present invention relates to removing the electric field from the internal volume of high voltage interconnects, such as bushings, connectors, and cables. The space of interest, for example, is that between the center conductor and the solid dielectric insulator that normally provides the primary electrical insulation from the outer conductor. This invention provides a conductive surface on the inside surface of the principal solid dielectric insulator surrounding the center conductor and connects the center conductor to this conductive surface. This simple approach removes the electric field across an inherently weak region and places it in the primary insulation. The advantage of removing the electric fields from the weaker dielectric region to a stronger area improves reliability, increases component life and operating levels, reduces noise and losses, and allows for a smaller compact design. While various techniques can be utilized to metalize desired regions, such depend, for example, on material, size, thickness, and surface accessibility, and the simplest method uses a standard electroless plating technique. Other known metalization techniques include, but are not limited to, vapor and energetic deposition, plasma spraying, conductive painting, and other controlled coating methods. The metalization approach in accordance with the present invention can be easily applied to existing high-voltage interconnect designs, and such receive an instant reduction of corona activity and related effects.

Figure 1B:
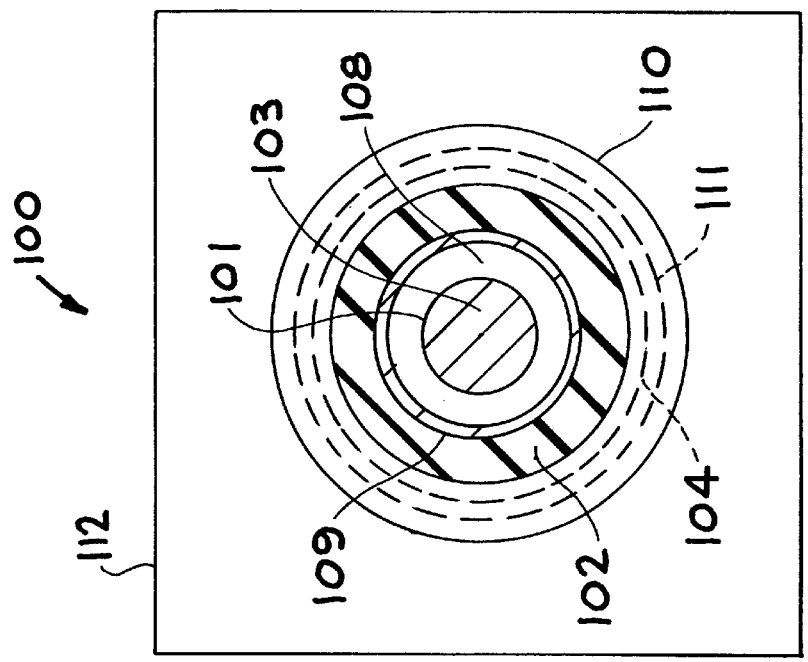
FIG. 1B is a view taken along the line 1B—1B of FIG. 1A.
Figure 1A:
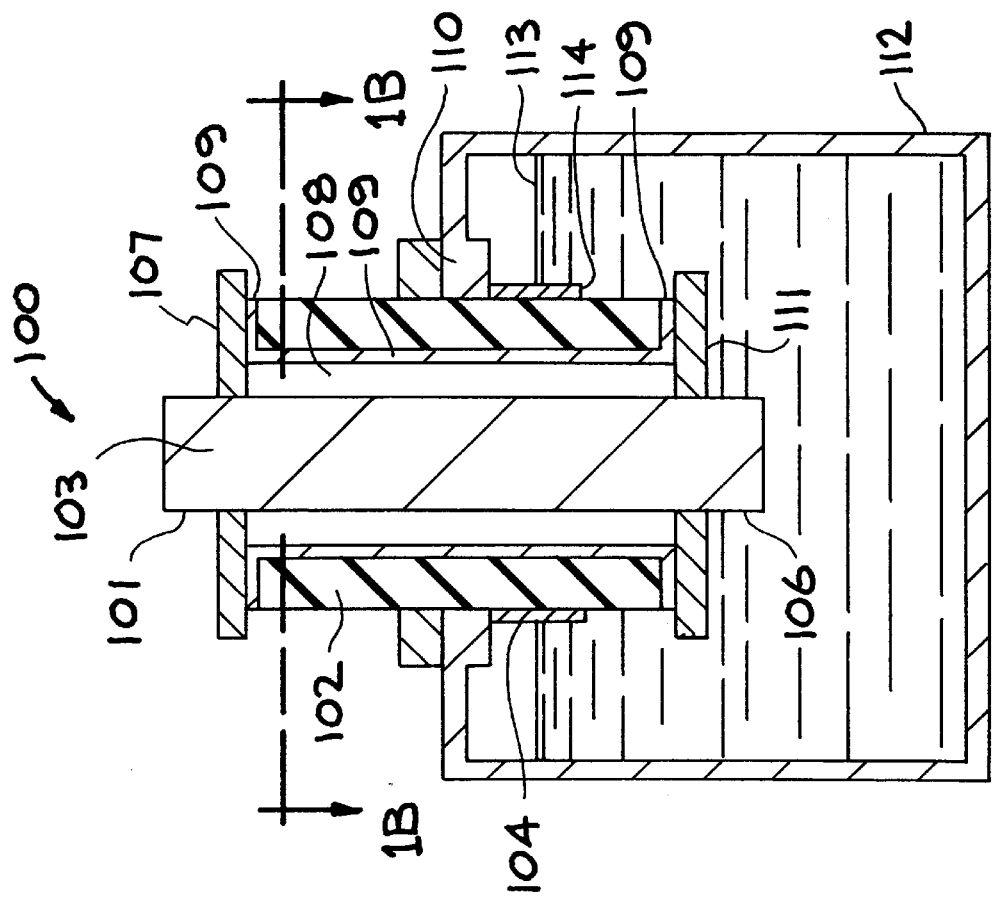
FIG. 1A is a cross-sectional view of a generic cylindrical high-voltage bushing.

FIGS. 1A and 1B illustrate cross-sectional views of a generic high-voltage bushing, 100, having a cylindrically symmetric design and generally used to insulate electrical conductors passing through metal walls of protective enclosures. A generic embodiment is used to show common features in bushings and to illustrate the essence of this invention as it applies to all highly electrical-stressed structures. The bushing insulator is typically constructed of a single continuous solid dielectric insulator material, 102, having an external (upper) section and an internal (lower) section. An external connection point, 101, is the high-voltage input to or output from an arbitrary high-voltage device located inside an enclosure, 112. The external solid dielectric insulator, 102, provides the primary electrical insulation between the internal bushing conductor, 103, and the enclosure, 112. The external solid dielectric insulator, 102, is typically shaped to prohibit surface flashover and provide structural support of the internal-bushing conductor, 103, of the bushing, 100. Internal bushing conductor, 103, provides the electrical connection from external connection point, 101, to the internal connection point, 106. Internal bushing conductor, 103, can be constructed of rigid metal or flexible cable. The enclosure, 112, is typically at ground potential. In the case of oil encapsulated systems, such as transformers, a metalized coating, 104, on the outer surface of the lower or internal solid dielectric insulator, 102, will extend the ground potential well inside the enclosure, 112, and below the oil fill line, 113. This metalized coating, 104, eliminates the triple-junction that would otherwise be created by the internal or lower section of the solid dielectric insulator, 102, as it penetrates the enclosure, 112, through the enclosure flange, 110, and relocates the triple point region, 114, to a higher dielectric strength environment of oil. The upper end flange, 107, and the lower end flange, 111, support the internal bushing conductor, 103, and provide a means to attach input and output connections. The void region, 108, extends between the solid dielectric insulator, 102, and the internal bushing conductor, 103, constituting a region of weaker dielectric material. In current art, this weaker dielectric region becomes a troublesome source of electrical corona discharge activity that reduces the reliability and operating level of the high-voltage bushing.

In the present invention, a metalized surface, 109, is applied to the inner surface of the cylindrically shaped solid dielectric insulator, 102. This metalized surface, 109, includes end sections which provide an electrical connection between the upper end flange, 107, the lower end flange, 111, the internal bushing conductor, 103, the external connection point, 101, and the internal connection point, 106, assuring that they are all at the same electrical potential. In this fashion, the void region, 108, is completely surrounded by metallic surfaces at the same potential, therefore no electric field can exist within the void region, 108, and thus there is no initiating source of electrical corona activity in this region FIG. 1B shows symmetry between the external connection point, 101, of bushing conductor 103; the void region, 108; the metalized surface, 109; and the solid dielectric insulator, 102.

Figure 2B:
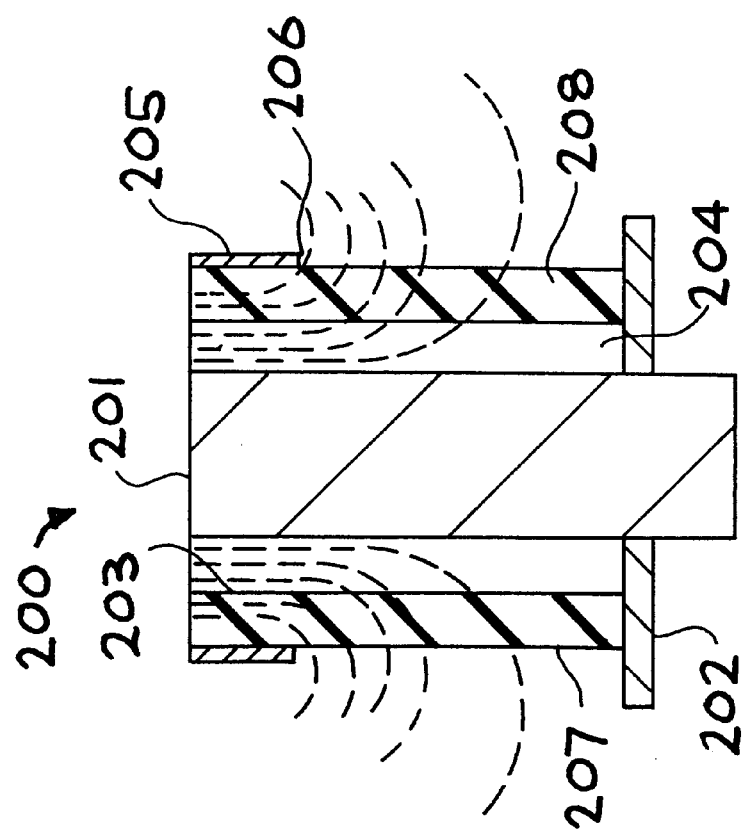
FIG. 2B illustrates the equal-potential field gradient lines in the typical bushing of FIG. 2A.
Figure 2A:
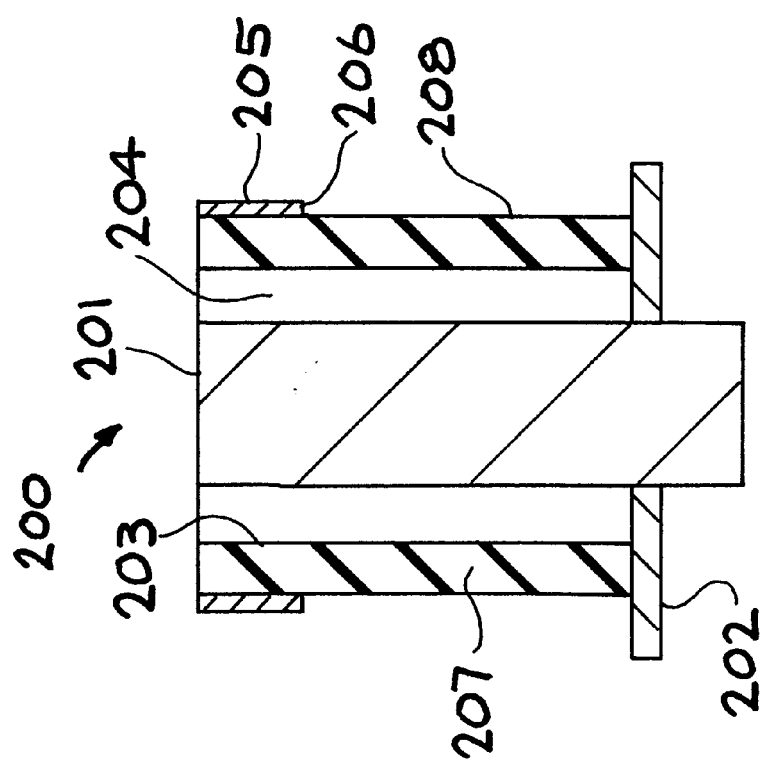
FIG. 2A is a cross-sectional view of a typical bushing with an extended outer metalized surface.

FIGS. 2A and 2B illustrate an expanded view of a bushing similar to that of FIGS. 1A–1B, showing the internal section of a high-voltage bushing, 200, below the oil-fill line, 113, without the improvement called out in this invention. This is representative of current art and depicts equipotential lines developed in the void region, 204. The internal bushing conductor, 201, and the lower end flange, 202, are electrically connected and provide for one of the two electrodes defining the equipotential lines developed in the void region, 204. The electrically opposing electrode is extended below the oil line, 113, by a metalized outer surface, 205. Fields are distributed across the void region, 204, and the solid dielectric insulator, 207, as a relationship of their discrete capacitance. The resulting equipotential lines developed in the void region, 204, reach the intrinsic breakdown level of the ambient air or oil before the intrinsic level of the solid dielectric insulator, 207, is reached. As a result, the internal section of the high-voltage bushing, 200, goes into electrical corona activity on the inside of the bushing opposite the triple point region, 206, or as it penetrates the enclosure, 112, opposite the enclosure flange, 110 (see FIG. 1A). When the exposed insulator surface, 208, is of sufficient length to inhibit the surface breakdown; electrical corona activity on the inner surface of the high-voltage bushing, 203, erodes the solid dielectric insulator, 207, until the unit catastrophically fails.

Figure 3B:
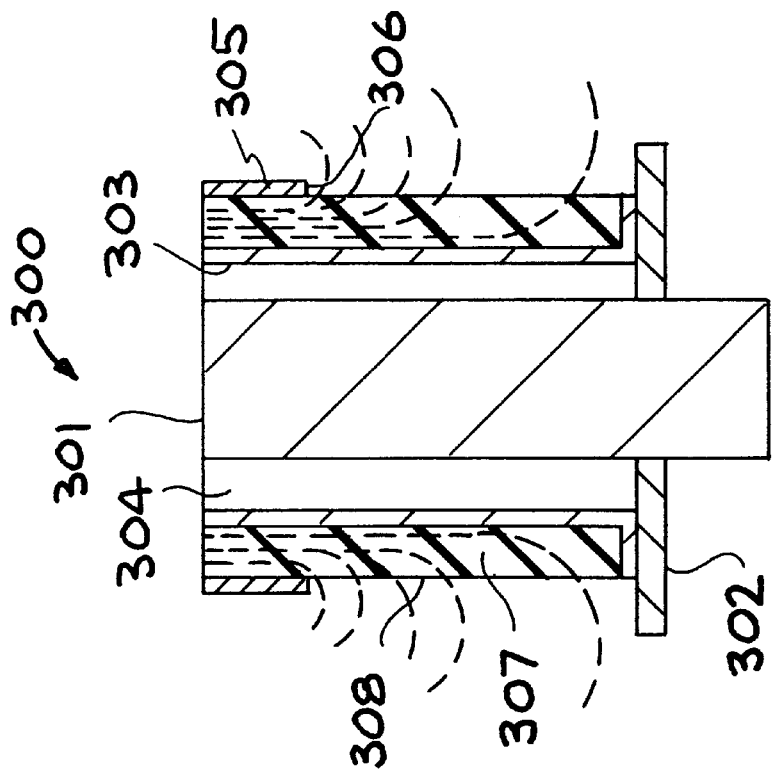
FIG. 3B illustrates the equal-potential field gradient lines in the improved bushing of FIG. 3A.
Figure 3A:
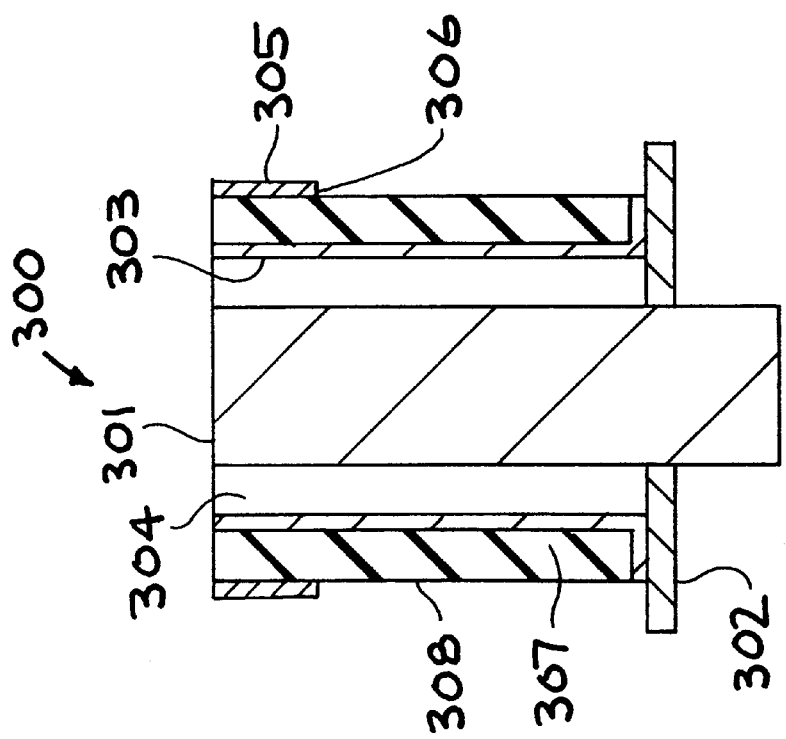
FIG. 3A is a cross-sectional view of an improved bushing made in accordance with the invention.

FIGS. 3A and 3B illustrate the internal section of and improved high-voltage bushing, 300, as an expanded view of FIG. 1A showing the bottom section of a typical high-voltage bushing, 100, below the oil fill line, 113 (see FIG. 1A). The internal bushing conductor, 301, lower end flange, 302, and the metalized inner surface of the high-voltage bushing, 303, are electrically connected by being in direct contact and are therefore at the same electrical potential as stated in the above description. The metalized outer surface, 305, of the solid dielectric insulator, 307, defines the lower section of the high-voltage bushing, 100, of FIG. 1A. The dashed lines in FIG. 3B indicate equal-potential gradient lines and are shown to be in the stronger dielectric material of the bushing solid dielectric insulator, 307, and not in the weaker dielectric material filling the void region, 304. The solid dielectric insulator, 307, is considered to be made of homogenous material without significant flaws or imperfections. The metalized inner and outer surface, 303 and 305, respectively, on portions of the cylindrical high-voltage bushing, 303, provide controls on the shape and density of the electrostatic field lines within the solid dielectric insulator, 307, between the two surfaces. When the metalized outer surface 305, ends at the triple region, 306, the electric fields within the solid dielectric insulator, 307, extend out into the surrounding oil environment, as governed by the geometric shape of the enclosure and nearby objects, as well as the relative dielectric constants. The triple point region, 306, will have the highest field-enhancement and is the likely point from which electrical failure will occur. The reason electrical breakdown begins from this location relates directly to the rapid change in the equipotential lines at the sharp edge of the metalized outer surface, 305. When the electric field stress at the triple point region, 306, exceeds the strength of the oil environment, electrical will occur in proximity to the insulator and an arc will develop across the exposed insulator surface, 308, and make attachment to the lower end flange, 302, resulting in an electrical failure that will likely cause permanent damage to the solid dielectric insulator, 307.

FIGS. 4A and 4B show the internal section of an improved high-voltage bushing, 400, previously shown in FIG. 3A. The improvement is realized by contouring the solid dielectric insulator, 407, in the vicinity of the triple point region, 306, as shown in FIG. 3A. The metalized region of the inner surface, 403, and metalized outer surface, 405, confine the radial electric field inside the solid dielectric insulator. A gradual increase in the electric field inside the body of the insulator, 407, is caused as the embedded electrode, 409, reshapes the internal fields, however, the electric field stress need not exceed the electrical strength of the insulator material, 407. The embedded electrode, 409, does serve to reduce the electric field enhancement at the triple point region, 406. As previously stated, the initiating mechanism for breakdown depends on the field-stress at this triple-junction and the reduced electric field provided at this point by the contoured embedded electrode, 409, improves reliability and operating levels. The contoured embedded electrode, 409, is designed to have a slope of about 135 degrees with relief to the metalized outer surface, 405, to allow air bubbles that might otherwise be trapped in the recessed portion of the embedded electrode, 409, to float up and away from the triple point region, 406.

Several methods of metalizing dielectric surfaces are possible. The preferred method of metalizing the surfaces 109, 303, 403, and 409 of the bushing insulator 102,,307, and 407 employs a strictly chemical process for plating copper and copper alloys on surfaces exposed in a chemical bath, also known as electroless chemical plating. Other methods for metalizing surfaces of ceramic dielectric materials can be employed, such as electroplating, depositing and baking metal-based inks, physical vapor deposition, chemical vapor deposition, plasma-assisted vapor deposition and plasma spraying of metal powders in a vacuum chamber, conductive painting, and other controlled coating techniques. Other material for metallic coatings can be employed, such as aluminum, nickel, silver, platinum, palladium, and gold, as well as alloys thereof. The metalized surface may have a thickness in the range of atomic level of the material to a millimeter. The dielectric material may be composed of ceramics, plastics, glass, fiberglass, mica, and rubber. Also, the conductive material may be of semiconductor materials, such as cuprous oxide, germanium, gallium arsenide, gallium phosphide, indium arsenide, lead sulfide, selenium, silicon, and silicon carbide.

Figure 5:
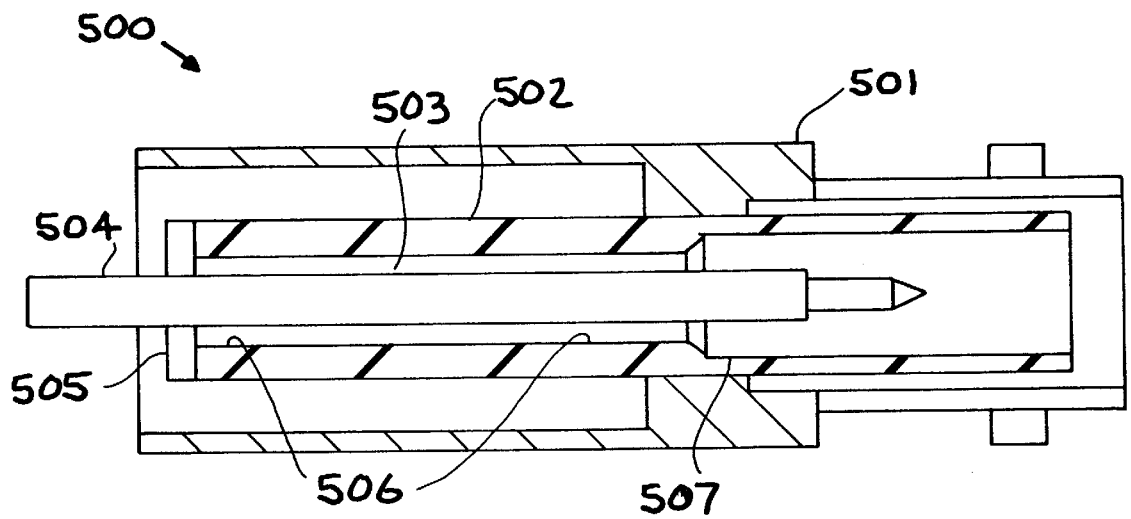
FIG. 5 is a cross-sectional view of an improved high-voltage connector having metalized surfaces, in accordance with the present invention.

Another method for passing electrical current through conductive walls of enclosures is by connectors. FIG. 5 shows a representative coaxial connector, 500, of an improved design in a typical configuration, such as a vacuum feedthrough The outer conductive shell, 501, of the connector attaches to the enclosure wall, which is typically grounded. The primary insulator, 502, is typically constructed of a solid dielectric material, such as plastic or ceramic. The void region, 503, between the insulator, 502, and the center conductor, 504, is typically filled with gas or liquid from the ambient environment, which is most often a weaker electrically insulating material than the stronger solid dielectric insulator, 502. A vacuum seal, 505, attaches the center conductor, 504, to the insulator, 502. The inner surface of the insulator, 502, is metalized from the vacuum seal, 505, to the region of 507. The result is that the center conductor, 504, and inner surface of adjoining dielectric, 506, are electrically connected, thereby ensuring that no electric field exists in the void region, 503, of weaker dielectric material.

Figure 6:
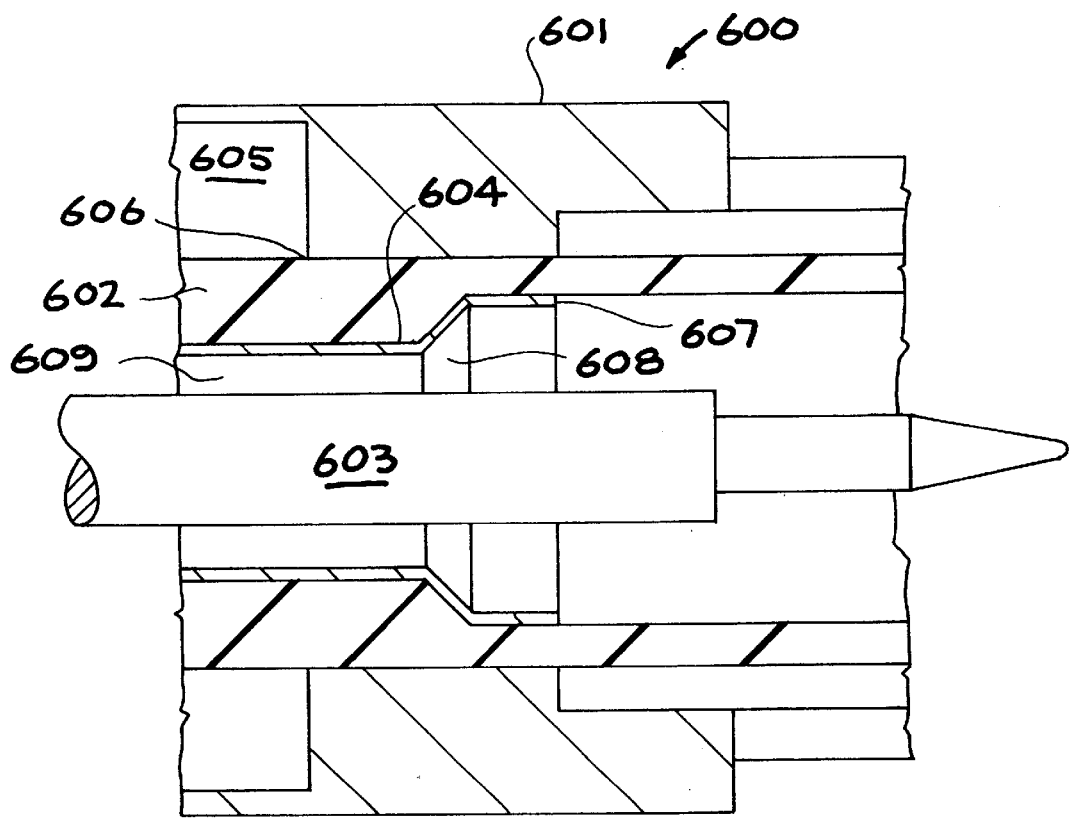
FIG. 6 is an expanded view of the highly-stressed region of the high-voltage connector of FIG. 5.

FIG. 6 illustrates an expanded or enlarged view of the region 507 of FIG. 5 and of controlling stress in coaxial type connectors, 600. The outer conductive shell, 601, provides the termination of the connector to the enclosure wall, as mentioned above. In addition, a vacuum seal is required between the outer conductive shell, 601, and the insulator, 602. The increased thickness of the insulator, 602, adjacent to the vacuum region, 605, provides added electrical strength to this section of the insulator. The vacuum triple-point region, 606, defines the highest region of stress in this vicinity. The center conductor, 603, and the inner surface region of metalization, 604, as mentioned above, are electrically connected, and, as such, remove the electrical fields in the weaker ambient region, 609. Metalizing the inner surface, 604, of insulator, 602, as shown, also removes the electrical fields from the dielectric support 608. Properly ending the metalization 604, defines the ambient atmosphere triple-point region 607. The atmosphere triple-point region 607, represents the significant electrical field enhancement in this connector.

Typical connectors use plastics as the principal dielectric material. Some vacuum feedthrough connectors will use ceramics as an insulator to be more compatible with the vacuum environment. Connectors using ceramics can easily use the same metalization process as described for high-voltage bushings. Plastics can be more challenging in quality plating. Platable acrylonitrile-butadiene-styrene (ABS) plastic has been shown to be a very useful dielectric. Another widely used plastic for connectors is Teflon (polytetrafluorethylene), presently requiring energetic deposition techniques. One possible lay down process for conductive surfaces on Teflon is by controlled explosive copper wire techniques.

Figure 7A:
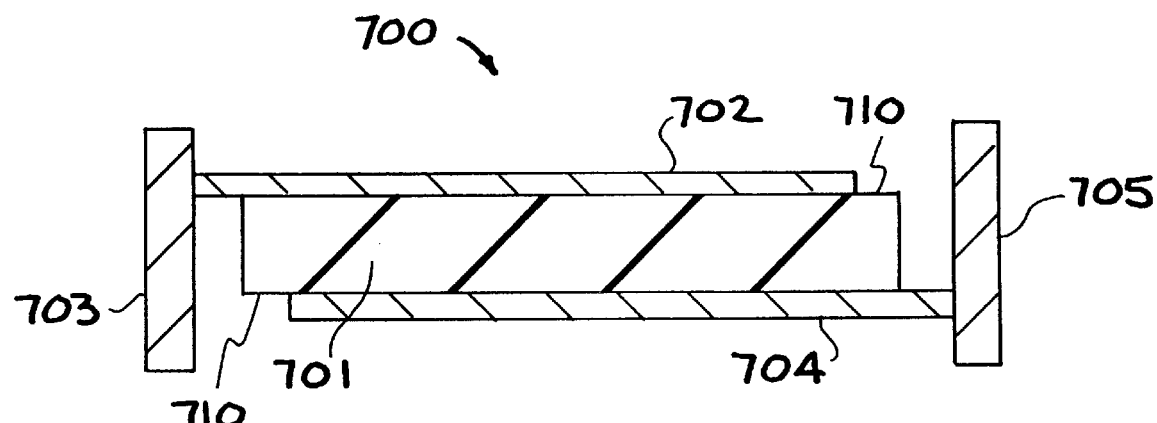
FIGS. 7A and 7B illustrate the upper and lower layers of metalized plastic film that are assembled, as shown in FIG. 7C, to construct an improved metalized-film capacitor.
Figure 7B:
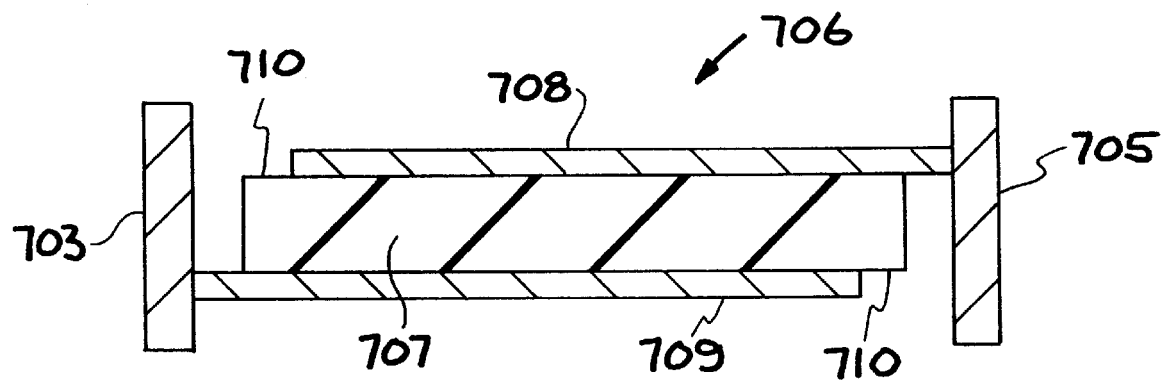
Figure 7C:
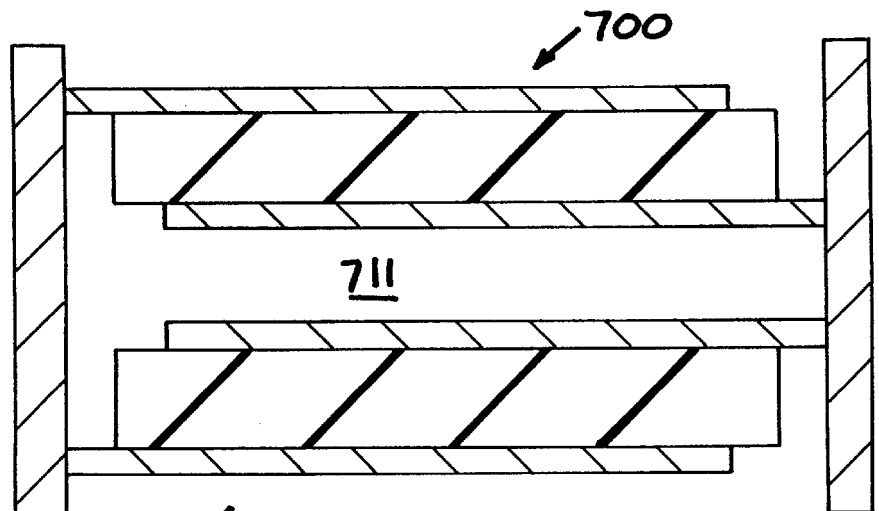

Another area for application of the present invention for improving performance of highly stressed electrical insulation structures includes improvement to metalized film and metalized film/foil capacitors. Multilayer film capacitors have several different construction techniques. Common to all current art capacitor structures involves alternating layers of conductive and nonconductive dielectric material. FIGS. 7A, 7B, and 7C illustrate cut-away views of a metalized film capacitor using the disclosed improved manufacturing technique. FIGS. 7A and 7B show a cross-section of the first and second metalized dielectric film, 700 and 706. The dielectric films 701 and 707 are continuous high-quality film material of homogenous material. The metalization process involves a quality conductive surface applied to both sides of the dielectric film with a masked region on opposite and opposing sides to provide nonconductive regions 710. The top layer of the first dielectric film 701 extends to a summing electrode for the positive electrode 703. In contrast, the bottom metalized layer 709 of the second dielectric film 707 extends to the same summing electrode for the positive electrode 703. The opposing electrodes, defined as the lower metalization 704 of the first metalized dielectric film 701 and the upper metalization 708 of the second dielectric 707, both extend to the summing electrode for the negative electrode 705. A detail to the manufacturing process is that the tape defining each of these metalized film/foils is the same, and in the roll-up process one of the tapes is turned over so that the metalized surfaces of the two adjacent metalized surfaces are in the same direction. The effect of this is illustrated in FIG. 7C by placing the first, 701, and second, 707, dielectric films in close proximity to each other. The void region, 711, typical to the above-mentioned regions, represents the weak area of dielectric material. During the roll-up assembly process the adjacent metalized surfaces make electrical contact by physical pressure and remove the electrical field across this weak void region 711. The current art for this type of capacitor is to have metal on one side of the dielectric with alternating extension of the electrode to define the capacitor electrodes. In contrast to this invention, the effect of the current art assembly process traps weaker dielectric material without a removal mechanism, as shown in FIG. 7C. As part of this invention, the process of eliminating weak electrical regions of stress is obtained by having metalized surfaces surrounding these regions of concern.

Figure 8:
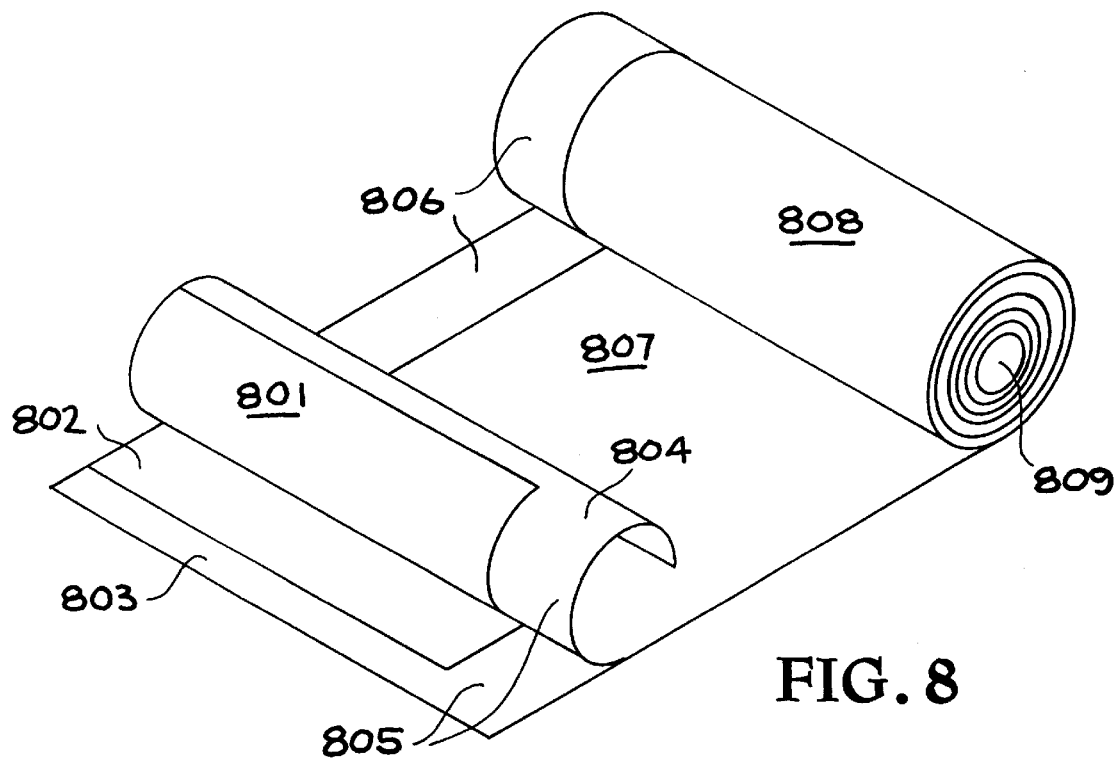
FIG. 8 is a view of an embodiment of a rolled up axial lead metalized-film capacitor.

FIG. 8 illustrates an example of a rolled up construction of an axial lead metalized film capacitor. Metalized surface, 801, on dielectric film, 804, and metalized surface, 802, on dielectric film, 803, are rolled adjacent to each other providing one of the capacitor electrodes. This process has removed electric fields that would normally be in this region and increases the reliability and operating levels. Similarly, metalized surface, 807, on dielectric film, 804, and metalized surface 808, on dielectric film 803, provide the other capacitor electrode. Similar connection to each of the extended electrodes is made with a conductive disk, 809. Surface areas, 805 and 806, provide insulation between the two electrodes defining the capacitor.

Figure 9:
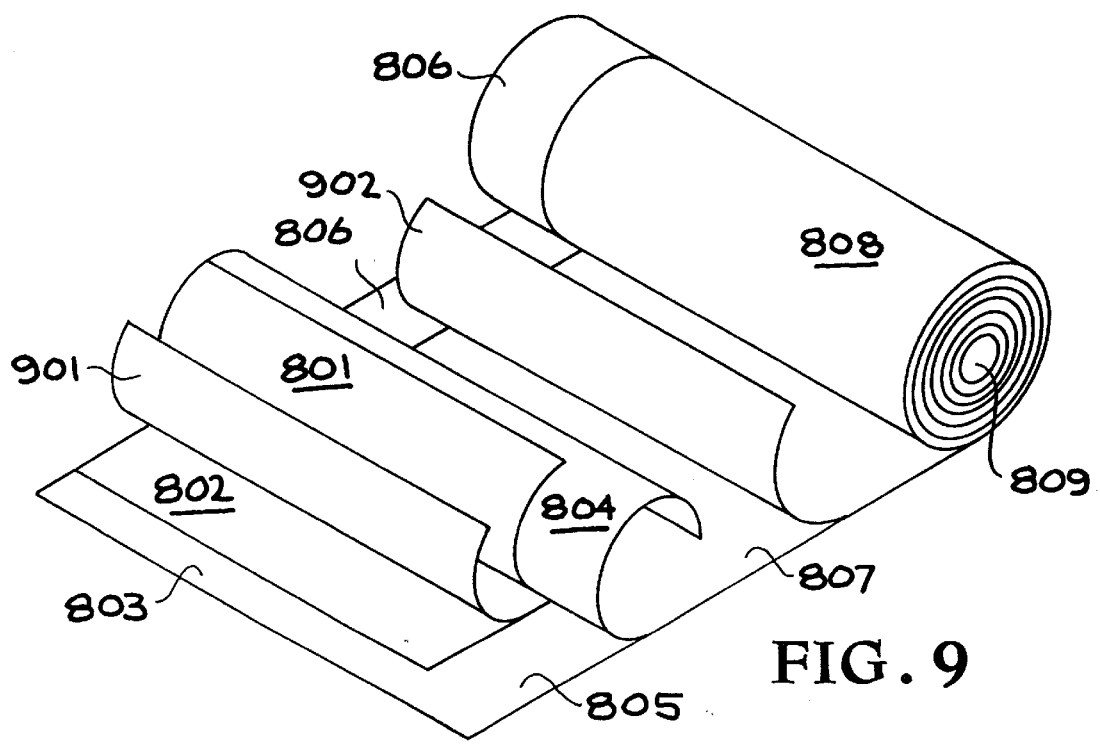
FIG. 9 is a view of an embodiment of a rolled up axial lead metalized-film, metal-foil capacitor.

FIG. 9 shows the inclusion of a metal foil, 901 and 902, rolled between the two otherwise adjacent metalized surfaces. The purpose of the foil provides a lower internal resistance, allows ease of electrode extension over the edge of the dielectric film, and allows high-current operations.

The optimum metalization technique for the FIGS. 8 and 9 application is vapor deposition with controlled masking in desired areas. The process can be done on both sides during a single pass or on a single side in a double pass.

It has thus been shown that the present invention enables the removal of electric field in weak areas of high-voltage interconnects, such as bushing, connectors, cables, capacitors, etc. In contrast to prior attempts to remove electric fields in weak regions, the invention provides a conductive surface on the inside surface of the principal solid dielectric insulator surrounding the center conductor and connects the center conductor to this conductive surface.

The use of this invention in manufacturing and field management applies to all high-voltage interconnects. In addition to improved life of existing high-voltage interconnects, a reduction of corona induced noise is anticipated. Some of the immediate applications include: accelerators, high-voltage bushings in power supplies, high-voltage connectors, compact high-voltage sources, and highly-reliable high-voltage structures. The use of this invention will improve equipment life expectancy, provide added compactness for the same operating levels, lighten the environmental impact from alternative field management controls, and improve the electromagnetic capability of equipment. Uses include power grid components, such as transformers, feed-through bushings and switch gear, high-voltage power supplies, modulators, high-voltage capacitors and tubes, and space-based communication systems.

While particular embodiments, materials, parameters, etc., have been described and/or illustrated to exemplify and teach the principles of he invention, such are not intended to be limiting. Modifications and changes may become apparent to those skilled in the art, and it is intended that the invention be limited only by the scope of the appended claims.

What is claimed is:

1. In a high-voltage structure having a first electrode surrounded by air or vacuum, a bulk insulator surrounded by air or vacuum, and a second electrode at a different potential, the improvement comprising:

means for preventing formation of an electric field across a weak region and placing the electric field in the bulk insulator, said means being spaced from said first electrode and comprising a conductive surface on an inside surface of the bulk insulator.

2. The high-voltage structure of claim 1, selected from the group consisting of bushings, connectors, coaxial connectors, film/foil capacitors, and cables.

3. The high-voltage structure of claim 1, wherein said conductive surface is composed of material selected from the group consisting of copper, copper alloys, aluminum, nickel, silver, platinum, palladium, gold, and alloys thereof.

4. The high-voltage structure of claim 1, wherein said bulk insulator is composed of dielectric materials selected from the group consisting of ceramics, plastics, glass, fiberglass, mica, and rubber.

5. The high-voltage structure of claim 1, wherein said conductive surface is composed of semiconductor materials selected from the group consisting of cuprous oxide, germanium, gallium arsenide, gallium phosphide, indium arsenide, lead sulfide, selenium, silicon, and silicon carbide.

6. The high-voltage structure of claim 1, wherein said conductive surface is formed after fabrication of the structure.

7. In a high-voltage interconnect having two electrodes of different potentials with two different dielectric materials separating the electrodes, the improvement comprising:

means for preventing formation of an electric field across the weaker of the two dielectric materials and placing the electric field in the stronger of the two dielectric materials, said means being spaced from said electrodes and comprising a conductive surface on an inside surface of the stronger of the two dielectric materials.

8. The high voltage of claim 7, wherein said means comprises a conductive surface on a surface of the stronger of the two dielectric materials.

9. The high voltage interconnect of claim 7, wherein said stronger of the two dielectric materials is composed of ceramic dielectric materials.

10. The high-voltage interconnect of claim 8, wherein said conductive surface has a thickness in the range from one angstrom to at least one millimeter.

11. The high-voltage interconnect of claim 8, wherein said conductive surface is composed of material selected from the group consisting of copper, copper alloys, aluminum, nickel, silver, and gold.

12. The high voltage interconnect of claim 8, selected from the group consisting of bushings, connectors, cables, and multilayer capacitors.

13. The high voltage interconnect of claim 12, wherein said interconnect consists of a multilayer capacitor of a metalized film/foil type.

14. The high voltage interconnect of claim 12, wherein said interconnect consists of a coaxial connector.

15. The high-voltage interconnect of claim 12, wherein said interconnect consists of bushings having a single, continuous solid dielectric material spaced from a central electrode.

* * * * *